United States Patent [19]
Kaminaga

[11] Patent Number: 5,699,146
[45] Date of Patent: Dec. 16, 1997

[54] SCANNING EXPOSURE APPARATUS WITH VELOCITY CALCULATING MEANS FOR STAGE ELEMENTS

[75] Inventor: Takeshi Kaminaga, Tokyo, Japan

[73] Assignee: Nikon Corporation, Tokyo, Japan

[21] Appl. No.: 539,550

[22] Filed: Oct. 5, 1995

[30] Foreign Application Priority Data

Oct. 5, 1994 [JP] Japan .................. 6-241473

[51] Int. Cl.⁶ .............. H01L 21/027; G03B 27/53; G03B 27/42
[52] U.S. Cl. ................ 355/53; 355/55; 355/77
[58] Field of Search .................. 355/50, 55, 53, 355/54, 77; 359/227, 232, 233, 234, 235; 250/203.7, 548; 356/363, 375, 400, 401, 27, 28; 396/116, 118

[56] References Cited

U.S. PATENT DOCUMENTS

| | | | |
|---|---|---|---|
| 4,924,257 | 5/1990 | Jain | 355/53 |
| 5,473,410 | 12/1995 | Nishi | 355/53 |
| 5,506,684 | 4/1996 | Ota et al. | 356/401 |
| 5,528,027 | 6/1996 | Mizutani | 250/234 |

Primary Examiner—Arthur T. Grimley
Assistant Examiner—Herbert Kerner
Attorney, Agent, or Firm—Armstrong, Westerman, Hattori, McLeland & Naughton

[57] ABSTRACT

The apparatus includes a reticle stage for carrying a reticle and a wafer stage having an X-stage for carrying a wafer. The reticle is moved in −X-direction by means of the reticle stage while the wafer is moved in +X-direction by means of the X-stage for scanning, so that the image of the pattern on the reticle is serially transferred and printed onto the wafer. A laser interferometer supplies i) to a velocity calculation unit, measured values representing the X-coordinate of the reticle stage as periodically measured with a predetermined period and ii) to a frequency divider, a sampling timing signal indicating each time the measured value has become definite. The frequency divider outputs a calculation trigger signal. The velocity calculation unit, in synchronism with the calculation trigger signal, reads (or samples) the measured values representing the X-coordinate of the reticle stage and performs a calculation in which the difference between two successively sampled measured values is divided by the period of the calculation trigger signal, so as to derive the velocity of the reticle stage with accuracy. The velocity of the X-stage is derived in a similar manner.

17 Claims, 3 Drawing Sheets

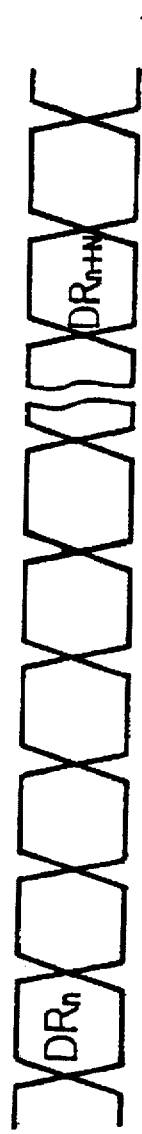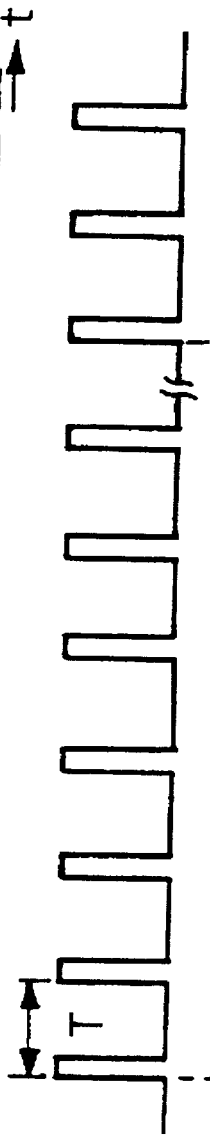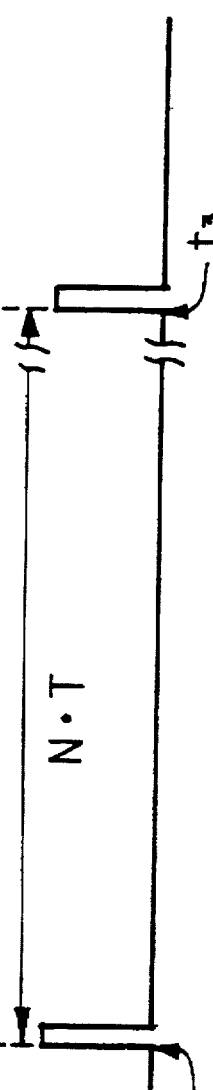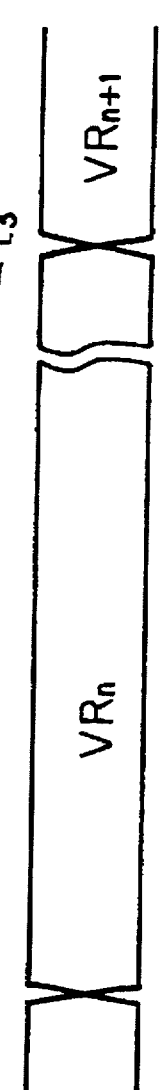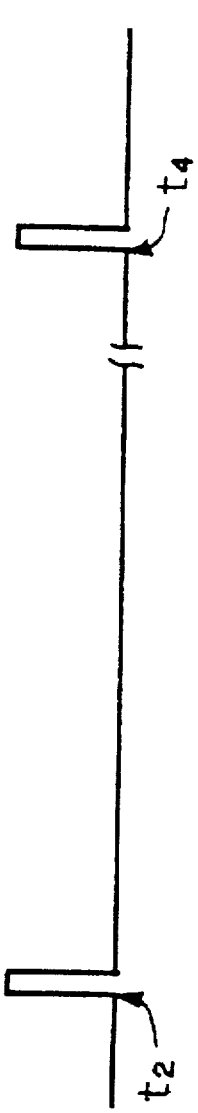
Fig. 2(a) DR
Fig. 2(b) TR1
Fig. 2(c) CR
Fig. 2(d) VR
Fig. 2(e) TR2

SCANNING EXPOSURE APPARATUS WITH VELOCITY CALCULATING MEANS FOR STAGE ELEMENTS

BACKGROUND OF THE INVENTION

1. Field of the Invention

The present invention relates to a scanning projection exposure apparatus and a method of performing a scanning projection exposure, which are utilized, for example, in the lithographic processes to fabricate various devices such as semiconductor devices and liquid crystal display devices, and in which a mask and a photosensitive substrate are moved in synchronism for scanning, so as to serially transfer a pattern from the mask onto the substrate by projection exposure.

2. Related Art

In a projection exposure apparatus wherein a pattern formed on a reticle (or a photomask, etc.) is transferred onto a photoresist-coated wafer (or a glass plate, etc.) by projection exposure through a projection lens system, it is desired to enlarge the exposure area on a wafer, in an attempt to accommodate the enlargement of the chip patterns of the semiconductor devices and/or to improve the throughput of the exposure step of the wafer. Much interest has been shown in the scanning projection exposure apparatuses of so-called step-and-scan type and slit-scan type, because they are considered to be ones of the most hopeful approaches to this object. In these scanning projection exposure apparatuses, a reticle and a wafer are moved in synchronism for scanning, and more specifically, the reticle is moved at a first constant velocity in a first direction traversing the optical axis of a projection lens system, while the wafer is moved at a second constant velocity in a second direction related to the first direction, the ratio between the first and second constant velocities being equal to the magnification ratio of the projection lens system.

In the scanning projection exposure apparatus, the exposure is performed using only a limited, partial region of the entire exposure field of the projection lens system, which provides a significant advantage. That is, for the same effective aperture of the projection lens system, a greater shot area can be exposed by the scanning projection exposure apparatus than by any of the projection exposure apparatus of the type wherein no-scanning is performed and the entire wafer is exposed through one shot of illumination (such as a stepper).

FIG. 3 shows a conventional type of scanning projection exposure apparatus. In FIG. 3, an illumination light beam IL for exposure is generated by an illumination system 1 to illuminate a slit-shaped area 3 on a pattern-carrying surface of a reticle 2, the area 3 being called the illumination field. An image of that portion of the pattern on the reticle 2 which is within the illumination field is projected through a projection lens system 8 onto and within a slit-shaped exposure field 13 on a wafer 12. Here, we define the direction of the optical axis AX of the projection lens system 8 as the Z-direction, the direction perpendicular to the Z-direction and parallel to the sheet surface of FIG. 3 as the X-direction, and the direction perpendicular to the sheet surface of FIG. 3 as the Y-direction. The X-direction is the scanning direction (i.e., the direction in which the reticle 2 and the wafer 12 are moved for scanning).

The reticle 2 is held on a reticle stage 4 which is driven in the X-direction on the reticle base 5 by means of a drive motor 6. The apparatus includes a moving mirror 4 fixedly mounted along one of the four edges of the reticle stage 4 and an interferometer 8 mounted at a stationary portion of the apparatus outside the reticle stage 4. The laser interferometer 8 emits a laser beam in the X-direction, which is reflected back by the moving mirror 7 to the interferometer 8, so that the X-coordinate DR of the position of the reticle stage 4 (and thus of the reticle 2) is periodically measured (or sampled) by the interferometer 8 with a predetermined sampling timing, and the measured values representing the X-coordinate DR are supplied to a control computer 9. The control computer 9 supplies a predetermined drive command signal AR through a motor drive system 10 to the drive motor 6 so as to control the position and the velocity of the reticle stage 4 for scanning.

The wafer 12 is held on a Z-stage 14 which is carried on a Y-stage 15. The Y-stage 15 is arranged and constructed for stepping operation of the wafer 12 in the Y-direction. The Y-stage 15 is carried on an X-stage 16 which is, in turn, carried on a wafer base 17. The X-stage 16 is arranged and constructed both for the stepping operation of the wafer 12 in the X-direction and for the linear motion of the wafer 12 at a constant velocity for scanning. The apparatus includes a moving mirror 19 for X-direction position measurement fixedly mounted along one of the four edges of the Z-stage 14 and an interferometer 20 for X-direction position measurement mounted at a stationary portion of the apparatus outside the X-stage 16. The laser interferometer 20 emits a laser beam in the X-direction, which is reflected back by the moving mirror 19 to the interferometer 20, so that the X-coordinate DW of the position of the X-stage 16 (and thus of the wafer 12) is periodically measured (or sampled) by the interferometer 20 with a predetermined sampling timing, and the measured values representing the X-coordinate DW are supplied to the control computer 9. The control computer 9 supplies a predetermined drive command signal AW through a motor drive system 21 to the driving motor 18 so as to control the position and the velocity of the X-stage 16 for scanning. The apparatus further includes a moving mirror for Y-direction position measurement fixedly mounted on the Z-stage 14 and a laser interferometer for Y-direction position measurement, which are similar to the moving mirror 19 and the laser interferometer 20 for X-direction position measurement and thus are not shown in the figure for the sake of simplicity. The moving mirror and the interferometer for Y-direction position measurement are used to measure the Y-coordinate of the position of the wafer 12, and the measured values are used to control the operation of the Y-stage 15.

The laser interferometers 8 and 20 periodically produce the measured (sampled) values representing the X-coordinate DR and the X-coordinate DW, respectively, with individual sampling timings. On the other hand, the control computer 9 reads (samples) the measured values representing the X-coordinates DR and DW with its own position signal sampling timing, which is based on the internally generated clock signal and thus is independent from the sampling timings of the interferometers 8 and 20. Just before starting a scanning projection exposure of the shot areas on a wafer, an error in alignment between a reticle mark formed on the reticle 2 and one of wafer marks formed on the wafer 12 which is associated with that shot area is detected by means of, for example, an alignment system (not shown), and the control computer 9 generates the drive command signals AW and AR to adjust the X-coordinates of the reticle stage 4 and/or the X-stage 16 (which carries the wafer) so as to null the detected error in alignment. Simultaneously, the Y-coordinate of the Y-stage 15 is adjusted in a similar manner.

Then, when the scanning projection exposure of the shot area is started, the control computer 9 begins to perform periodical calculations in order to derive, from the values representing the X-coordinates DR and DW which are periodically read (sampled) into the control computer 9 with the sampling period $T_1$, the values representing the velocity VR of the reticle stage 4 in −X-direction (or +X-direction) and the values representing the velocity VW of the X-stage 16 in +X-direction (or −X-direction), respectively. Further, the control computer 9 begins to generate the drive command signals AW and AR so as to control and maintain the velocity VW of the X-stage 16 to be at β*VR (where β is the magnification ratio of the projection lens system 11) and the velocity VR of the reticle stage 4 to be at a predetermined reference velocity. In addition, the control computer 9 may conduct a measurement of any error in alignment between each of several reticle marks formed on the reticle 4 and the corresponding one of several wafer marks formed on the wafer 12 during the scanning projection exposure of the of shot areas, so that the measured error between the marks may be used to correct the error in alignment between the reticle stage 4 and the X-stage 16 in the X-direction.

Unfortunately, the scanning projection exposure apparatus of the conventional type described above suffers from a severe problem. That is, since the laser interferometers 8 and 20 and the control computer 9 have their own sampling timings which are independent from each other, the sampling timing with which the position signals are read (sampled) into the control computer 9 is not in synchronism with the sampling timings with which the laser interferometers 8 and 20 measure (sample) and produce position data.

Using the period $T_1$ of the sampling timing of the control computer 9 (i.e., the timing with which the position signals are read (sampled) into the control computer 9) and two sampled, measured values $DR_i$ and $DR_j$ representing the X-coordinate DR of the reticle stage 4 and successively read into the control computer 9, a calculation is performed to obtain the velocity VR of the reticle stage 4 at the point of time when the second measured value is read into the control computer 9 as $(DR_j-DR_i)/T_1$.

However, there could be produced an inevitable error between the period or interval $T_1$ of the sampling timing of the control computer 9 and the interval $T_O$ between the points of time at which the two measured values $DR_i$ and $DR_j$ are actually measured. This error could be in the order of ±T at maximum, where T is the period of the sampling timing of the laser interferometers 8 and 20. As the result, the calculated values derived by the control computer 9, which should represent the velocities of the reticle stage 4 and the X-stage 16 in motion for scanning, do in fact contain errors which may possibly be greater when the period T is longer. This tends to lead to a failure in controlling and maintaining the velocity VW of the X-stage 16 (which carries the wafer) to be at β*VR with precision, resulting in occurrences of various shortcomings such as a degradation in resolution of the image projected on the wafer 12 and/or a degradation in registration between the circuit pattern(s) previously transferred onto the wafer and the image of an additional circuit pattern to be successively projected onto the wafer.

Moreover, if the error between the period or interval $T_1$ of the sampling timing of the control computer 9 and the interval $T_O$ of the points of time at which the measured values are actually measured does change during a scanning projection exposure of a single shot area, the projection magnification ratio in the scanning direction varies during that exposure, which provides an inconvenient distortion in the image transferred onto the wafer.

In view of the foregoing, it is an object of the present invention to provide a scanning projection exposure apparatus in which it is ensured that the magnification ratio, in the scanning direction, of an image of a pattern transferred from a mask (such as a reticle) to a photosensitive substrate (such as a wafer), should be a desired ratio and the transferred image should be free from any distortion in the scanning direction.

It is another object of the present invention to provide a method of performing a scanning projection exposure in which it is ensured that the magnification ratio, in the scanning direction, of an image of a pattern transferred from a mask (such as a reticle) to a photosensitive substrate (such as a wafer) should be a desired ratio and the transferred image should be free from any distortion in the scanning direction.

SUMMARY OF THE INVENTION

According to one aspect of the present invention, there is provided a scanning projection exposure apparatus comprising: a light source for generating an illumination light beam for exposure; a mask stage for carrying a mask thereon; a substrate stage for carrying a photosensitive substrate thereon; a first displacement detection device for measuring the position of the mask stage in a first direction; a second displacement detection device for measuring the position of the substrate stage in a second direction; a first velocity calculation unit for calculating the velocity of the mask stage base on a first measuring timing of the first displacement detection device; a second velocity calculation unit for calculating the velocity of the substrate stage base on a second measuring timing of the second displacement detection device; and a stage control unit for controlling the velocities of the mask stage and the substrate stage based on the calculated velocities derived by the first and second velocity calculation units.

The first displacement detection device may produce i) information about the measured position of the mask stage and ii) a first timing signal indicating each time when the information about the measured position of the mask stage has become definite; and the second displacement detection device may produce i) information about the measured position of the substrate stage and ii) a second timing signal indicating each time the information about the measured position of the substrate stage has become definite.

The first velocity calculation unit may calculate the velocity of the mask stage base on i) the information about the measured position of the mask stage produced by the first displacement detection device and ii) a time interval obtained base on the first timing signal; and the second velocity calculation unit may calculate velocity of the substrate stage base on i) the information about the measured position of the substrate stage produced by the second displacement detection device and ii) a time interval obtained base on the second timing signal.

According to another aspect of the invention, there is provided a method of performing a scanning projection exposure using an apparatus including a light source for generating an illumination light beam for exposure, a mask stage for carrying a mask thereon, and a substrate stage for carrying a photosensitive substrate thereon, the method comprising the steps of: measuring first and second positions of the mask stage in a first direction, and producing in synchronism with the timing of the measurements of the first and second positions a first timing signal indicating each time when information about the first and second positions has become definite with respect to each of the first and second positions; measuring and producing third and fourth positions of the substrate in the second direction, and producing in synchronism with the timing of the measurements of the third and fourth positions a second timing signal indicating each time information about the third and fourth positions has become definite with respect to each of the third and fourth positions; deriving by calculation a velocity of the mask stage from i) the information about the first and second positions of the mask stage and ii) a time interval obtained base on the first timing signal; deriving by calculation a velocity of the substrate stage from i) the information about the third and fourth positions of the substrate and ii) a time interval obtained base on the second timing signal; and controlling the velocities of the mask stage and the substrate stage based on the derived, calculated velocities of the mask stage and the substrate stage.

According to a further aspect of the present invention, there is provided a method of performing a scanning projection exposure using an apparatus including a light source for generating an illumination light beam for exposure, a mask stage for carrying a mask thereon, and a substrate stage for carrying a photosensitive substrate thereon, the method comprising the steps of: measuring a position of the mask stage and producing a first timing signal in synchronism with the timing of the measurement of the position of the mask stage; measuring a position of the substrate and producing a second timing signal in synchronism with the timing of the measurement of the position of the substrate in the second direction; deriving by calculation a velocity of the mask stage base on the first timing signal; deriving by calculation a velocity of the substrate stage base on the second timing signal; and controlling the velocities of the mask stage and the substrate stage based on the derived, calculated velocities of the mask stage and the substrate stage.

According to a further aspect of the present invention, there is provided a method of performing scanning projection exposure comprising: measuring positions of a mask stage and a substrate stage; and calculating the velocities of the mask stage and the substrate stage base on a measuring timing of the positions.

BRIEF DESCRIPTION OF THE DRAWINGS

The above and other objects, features, and advantages of the present invention will be appreciated as they become better understood by reference to the following detailed description when considered in connection with the accompanying drawings in which:

FIGS. 2(a) through 2(e) are timing charts of various signals illustrating the operation of the scanning projection exposure apparatus of FIG. 1.

DETAILED DESCRIPTION OF PREFERRED EMBODIMENTS

Figure 1:
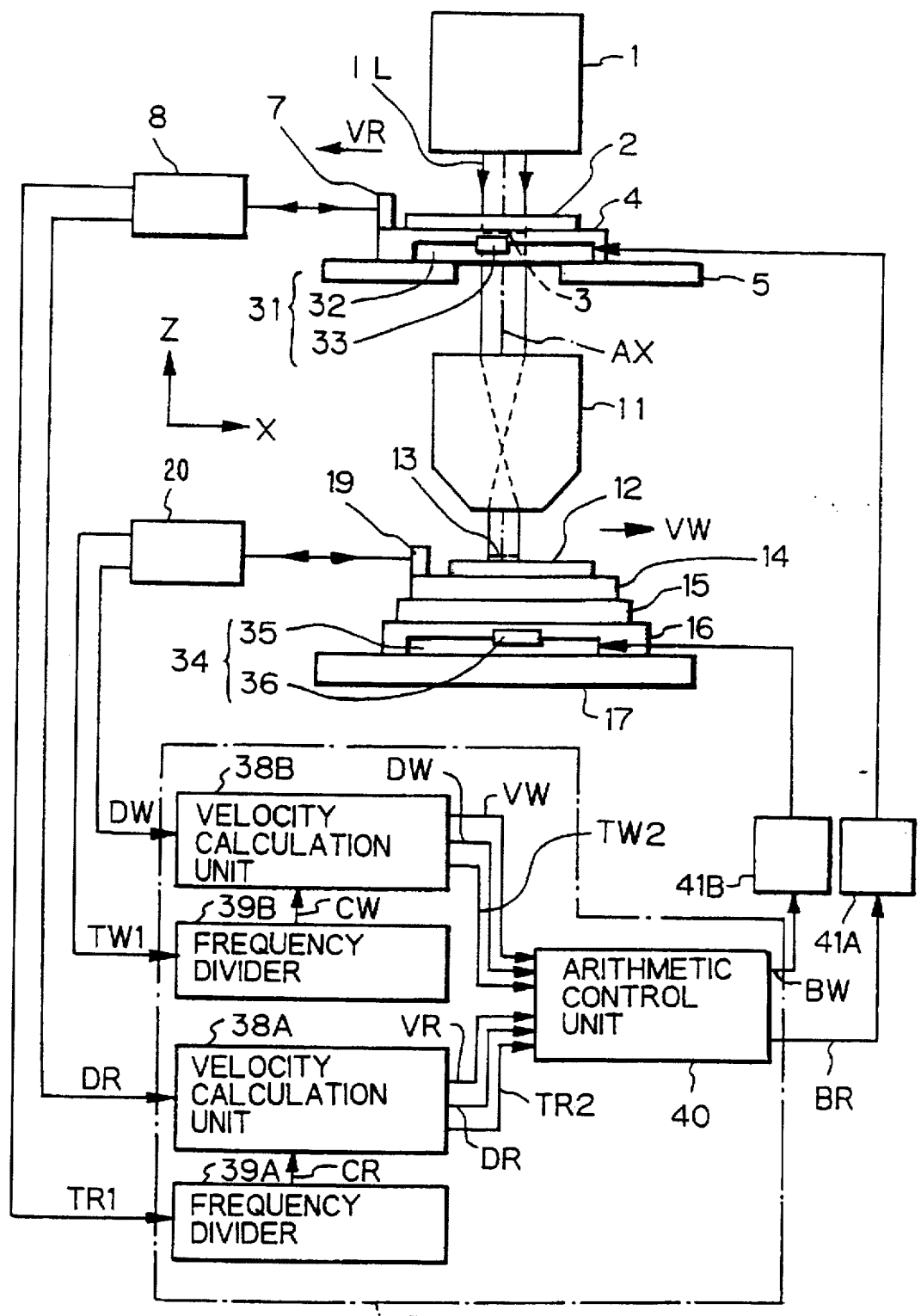
FIG. 1 is a schematic showing a scanning projection exposure apparatus according to an embodiment of the present invention.
Figure 3:
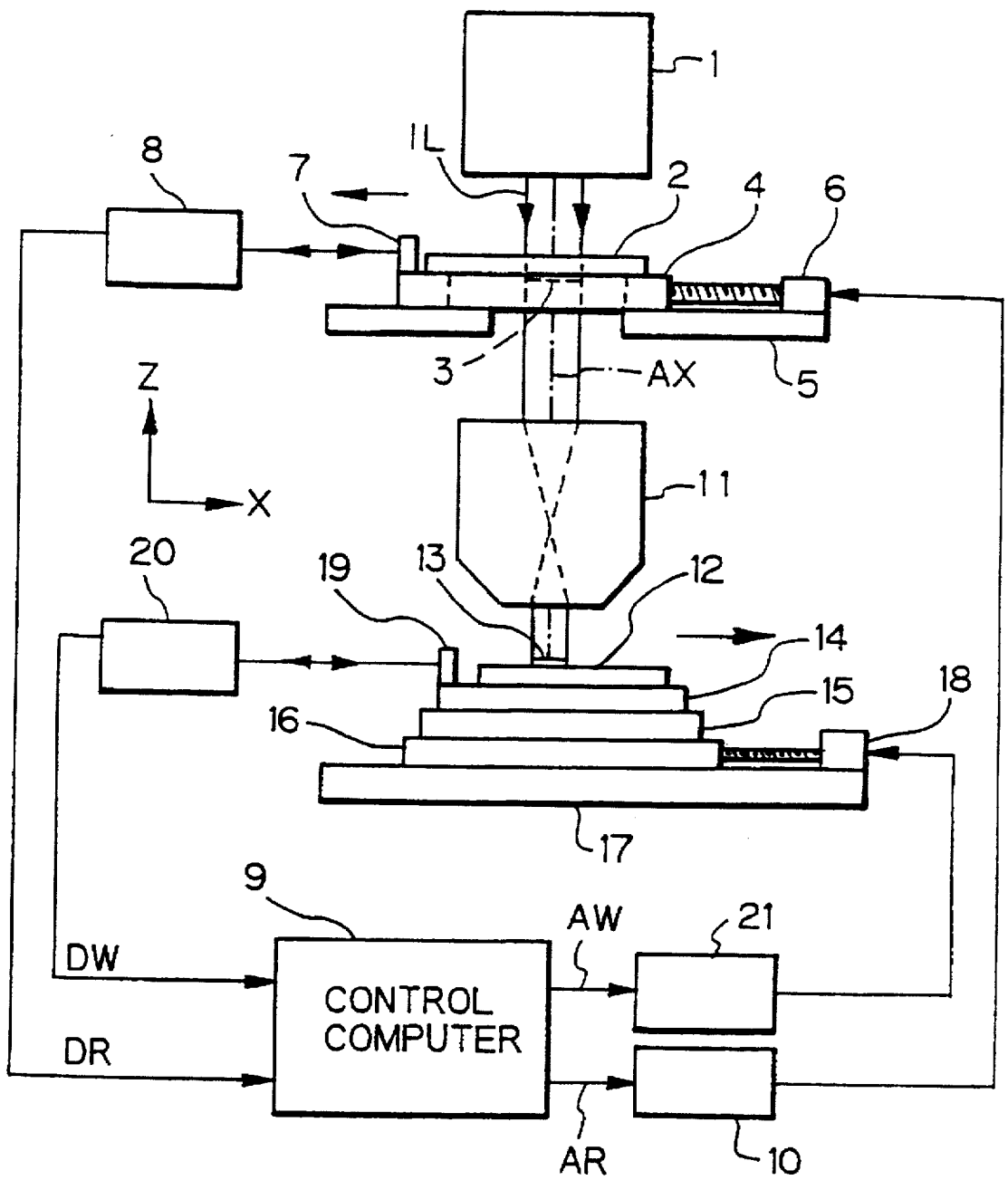
FIG. 3 is a schematic showing a conventional type of scanning projection exposure apparatus.

Referring now to FIGS. 1 and 2(a) through 2(e) a scanning projection exposure apparatus according to a preferred embodiment of the present invention will be described. This embodiment shows an exemplified application of the present invention to a step-and-scan type of scanning projection exposure apparatus. In FIG. 1, components and elements corresponding to those shown in FIG. 3 are designated by the same reference numerals as used in FIG. 3 and will, for the sake of simplicity, not be described in detail. Further, in the following description, the scanning direction (i.e., the direction in which a wafer and a reticle are moved for scanning) is defined as the X-direction. Although some of the components and elements of this apparatus move and operate in various directions, only the operations in the X-direction will be described here.

FIG. 1 shows the step-and-scan type of scanning projection exposure apparatus according to the present embodiment. In FIG. 1, an illumination light beam IL illuminates a slit-shaped illumination field 3 on a reticle 2, and that portion of a pattern formed on the reticle 2 which is within the illumination field 3 is projected through a projection lens system 11 onto and within a slit-shaped exposure field 13 on a photoresist-coated wafer 12. Further, the reticle 2 and the wafer 12 are moved for scanning. That is, the reticle 2 is moved relative to the illumination field 3 in the −X-direction (or +X-direction) by means of a reticle stage 4, while the wafer 12 is moved relative to the exposure field 13 in the +X-direction (or −X-direction) by means of an X-stage 16. Through the movements of the reticle 2 and the wafer 12, the image of the pattern on the reticle 2 is transferred and printed onto one of the shot areas on the wafer 12, and the repetition of the above operation provides serial transfer of the images of the pattern onto the shot areas.

In the present embodiment, the reticle stage 4 is driven in the X-direction by means of a linear motor 31 comprising a stator 32 fixed to a reticle base 5 and a so-called "rotor" 33 fixed to the reticle stage 4, while the X-stage 16 is driven in the X-direction by means of a linear motor 34 comprising a stator 35 fixed to a wafer base 17 and a so-called "rotor" 36 fixed to the X-stage 16. The X-coordinates of the reticle stage 4 and the X-stage 16 are measured by a laser interferometer 8 (for the reticle) and a laser interferometer 20 (for the wafer). Each of the laser interferometers 8 and 20 comprises an He-Ne laser source generating a laser beam to detect the displacement of a moving mirror (7 or 19) with reference to a fixed mirror (not shown), using a known heterodyne interferometry method.

The laser interferometer 8 periodically produces, with a predetermined sampling period T as shown in FIG. 2(a), the measured (sampled) values which represent the X-coordinate DR of the reticle stage 4. The laser interferometer 8 also produces a position data sampling timing signal TR1 which indicates each time the signal representing the measured values has become definite, as shown in FIG. 2(b). More particularly, during a time period from a rise (i.e., a change from low level "zero" to high level "one") in the sampling timing signal TR1 occurred at the point of time $t_1$ to the next rise in the sampling timing signal TR1, a measured value $DR_n$ continues to be produced which represents the X-coordinate DR of the reticle stage 4 at a point of time near $t_1$. Actually, the measured values representing the X-coordinate DR are produced on a parallel bus, and FIG. 2(a) shows the state of the signal on one of the lines of the bus.

Referring again to FIG. 1, The measured values representing the X-coordinate DR, as well as the sampling timing signal TR1, are supplied to a stage control system 37. The stage control system 37 includes a velocity calculation unit 38A having a data input, to which the measured values representing the X-coordinate DR are supplied. The stage control system 37 further includes a frequency divider 39A, to which the sampling timing signal TR1 is supplied. The frequency divider 39A has a frequency-division factor of N (i.e., it produces the output of a frequency which is 1/N that of the input, where N is an integer greater than one). Thus, the frequency divider 39A produces an output signal which is generated from the sampling timing signal TR1 through the frequency-division operation by the factor of N. This output signal, called the calculation trigger signal CR, is a periodical signal having a period of N*T as shown in FIG. 2(c), and supplied to an interrupt signal input of the velocity calculation unit 38A. Each time the calculation trigger signal CR goes high (to level "one"), the then measured value representing the X-coordinate DR is read (sampled) into the velocity calculation unit 38A and a calculation is performed in which the difference between the last read (sampled) and the next last read (sampled) measured values representing the X-coordinate DR is divided by the period N*T of the calculation trigger signal CR, so as to derive the calculated value representing the velocity VR of the reticle stage 4. The velocity calculation unit 38A supplies to an arithmetic control unit 40 i) the calculated value for the velocity VR thus derived, ii) a sampling timing signal TR2 which indicates each time the signal representing the calculated values for the velocity VR has become definite, and iii) the last read (sampled) measured value for the X-coordinate DR which has been used for deriving that calculated value for the velocity VR.

An example of the sampling period T of the measured values representing the X-coordinate DR as sampled by and produced from the laser interferometer 8 is 100 μsec. An example of the frequency-division factor N of the frequency divider 39A is "10". Using these figures, the period or interval of the occurrences of the velocity calculation by the velocity calculation unit 38A will be 1 msec.

For example, let us assume that the sampling timing signal TR1 goes high (to level "one") at a point of time $t_1$ which causes the calculation trigger signal CR to go high (to level "one") as shown in FIG. 2(c), while the interferometer 8 starts producing at the point of time $t_1$ a measured value $DR_n$ representing the X-coordinate DR. In this situation, the measured value $DR_n$ representing the X-coordinate DR will be read (sampled) into the velocity calculation unit 38A just after $t_1$. Here, the preceding sampled measured value representing the X-coordinate DR, which has been sampled into the velocity calculation unit 38A preceding the last sampled measured value $DR_n$, is designated by $DR_{n-N}$. The interval between the points of time at which these measured values $DR_n$ and $DR_{n-N}$ are sampled into the velocity calculation unit 38A is N*T. Therefore, the velocity calculation unit 38A derives a velocity value $VR_n$ representing the velocity VR of the reticle stage 4 in the X-direction at $t_1$ by performing the following calculation.

$$VR_n = (DR_n - DR_{n-N})/(N*T) \quad (1)$$

Thereafter, as shown in FIG. 2(d), at a point of time $t_2$, the velocity calculation unit 38A starts producing the calculated value $VR_n$ representing the velocity VR, and causes the sampling timing signal TR2 to go high (to level "one"), remain at that level for a predetermined time and go low (to level "zero") again, as shown in FIG. 2(e). Then, at a point of time $t_3$, when a length of time N*T has just passed after the point of time $t_1$ and when the sampling timing signal TR1 goes high (to level "one"), the value representing the X-coordinate DR becomes the measured value $DR_{n+N}$ and the calculation trigger signal CR goes high (to level "one"), so that the measured value $DR_{n+N}$ will be read (sampled) into the velocity calculation unit 38A. Then, the velocity calculation unit 38A derives a velocity value $VR_{n+1}$ representing the velocity VR of the reticle stage 4 in the X-direction at $t_3$, by performing the following calculation.

$$VR_{n+1} = (DR_{n+N} - DR_n)/(N*T) \quad (2)$$

Thereafter, as shown in FIG. 2(d), at a point of time $t_4$, the velocity calculation unit 38A starts producing the calculated value $VR_{n+1}$ representing the velocity VR, and causes the sampling timing signal TR2 to go high (to level "one"), remain at that level for the predetermined time and go low (to level "zero") again, as shown in FIG. 2(e). The velocity calculation unit 38A repeats the above calculation so as to output the results periodically.

Referring again to FIG. 1, like the laser interferometer 8 for the reticle described above, the laser interferometer 20 for the wafer periodically produces, with the predetermined sampling period T, the measured (sampled) values which represent the X-coordinate DW of the X-stage 16. The laser interferometer 20 also produces a position data sampling timing signal TW1 which indicates each time when the signal representing the measured values has become definite. The stage control system 37 includes a second velocity calculation unit 38B having a data input, to which the measured values representing the X-coordinate DW are supplied. The stage control system 37 further includes a second frequency divider 39B, to which the sampling timing signal TW1 is supplied. The frequency divider 39B has a frequency-division factor of N. The frequency divider 39B produces an output signal which is generated from the sampling timing signal TW1 through the frequency-division operation by the factor of N. This output signal, called the calculation trigger signal CW, is supplied to an interrupt signal input of the velocity calculation unit 38B. The frequency dividers 39A and 39B are initially reset such that the interval during which they remain at high level "one" is shorter than the sampling period T of the laser interferometers 8 and 20.

At each time the calculation trigger signal CW goes high (to level "one"), the then measured value representing the X-coordinate DW is read (sampled) into the velocity calculation unit 38B and a calculation is performed in which the difference between the last read (sampled) and the next last read (sampled) measured values representing the X-coordinate DW is divided by the period N*T of the calculation trigger signal CW, so as to derive the calculated value representing the velocity VW of the X-stage 16. The velocity calculation unit 38B supplies to the arithmetic control unit 40 i) the calculated value for the velocity VW thus derived, ii) a sampling timing signal TW2 which indicates each time when the signal representing the calculated values for the velocity VW has become definite, and iii) the last read (sampled) measured value for the X-coordinate DW which has been used for deriving that calculated value for the velocity VW. For deriving the calculated value, the velocity calculation unit 38B performs a calculation similar to that performed by the velocity calculation unit 38A.

At the arithmetic control unit 40, the measured value representing the X-coordinate DR of the reticle stage 4 and the calculated value representing its velocity VR are read into the unit 40 in synchronism with (at each time a rise occurs in) the sampling timing signal TR2, and the measured value representing the X-coordinate DW of the X-stage 16 (which carries the wafer) and the calculated value representing its velocity VW are read into the unit 40 in synchronism with (at each time a rise occurs in) the sampling timing signal TW2. Just before starting a scanning projection exposure of the shot areas on a wafer, the arithmetic control unit 40 generates drive command signals BR and BW to motor drive systems 41A and 41B, respectively, so as to adjust the X-coordinates of the reticle stage 4 and/or the X-stage 16. The drive command signals BR and BW have correspondences with the driving speeds of the linear motors 31 and 34, respectively, and the motor drive systems 41A and 41B supply to the linear motors 31 and 34 the required currents for achieving the driving speeds of the respective motors.

Then, when a scanning projection exposure of a shot area is started, the arithmetic control unit 40 begins to generate the drive command signals BR and BW, using the calculated values representing the velocities VR and VW of the reticle stage 4 and the X-stage 16, respectively, which are periodically read into the unit 40 and a known value of the magnification ratio β of the projection lens system 11 (the value of the magnification ratio β may be, for example, ¼, ⅕, and others). The drive command signals BR and BW are generated so as to control and maintain the velocity VW of the X-stage 16 to be at β*VR and the velocity VR of the reticle stage 4 to be at a predetermined reference velocity. In addition, the error in alignment between the reticle stage 4 and the X-stage 16 in the X-direction may be corrected during the scanning projection exposure of the shot area if desired. Based on the drive command signals BR and BW, the velocity VR of the reticle stage 4 is set at the predetermined reference velocity and the velocity VW of the X-stage 16 is set at β*VR.

As clearly understood from the above, according to the embodiment described above, the measured values representing the X-coordinates DR and DW are read (sampled) in synchronism with the calculation trigger signals CR and CW which are obtained by effecting frequency-division operations to the sampling timing signals TR1 and TW1 from the interferometers 8 and 20, respectively, and the differences between two successively read (sampled) measured values representing the respective X-coordinates and read (sampled) successively are divided by the period of the calculation trigger signals CR and CW, so as to derive the calculated values representing the velocities of the reticle stage 4 and the X-stage 16, respectively. Therefore, the sampling period with which the measured values representing the X-coordinates are to be read (sampled) is exactly equal to the period which is used as the divisor used in the calculation for deriving the velocities, so that the calculated values representing the velocities of the reticle stage 4 and the X-stage 16 in the X-direction are obtained with great accuracy, enabling a precision control of the velocities of the reticle stage 4 and the X-stage 16 in their movements for scanning. As the result, an image of the pattern on the reticle 2, which is magnified in the scanning direction accurately with the magnification ratio β, can be projected onto the associated shot area on the wafer 12, with a high resolution and without any distortion in the image in the scanning direction.

The functions of the velocity calculation units 38A and 38B and the arithmetic control unit 40 used in the embodiment described above may be implemented by the software for a computer. In the embodiment described above, the calculation trigger signals CR and CW are obtained from the sampling timing signals TR1 and TW1 using the frequency dividers 39A and 39B. However, they may be alternatively obtained using counters in place of the frequency dividers. Further, it is contemplated to use the sampling timing signals TR1 and TW1 themselves as the calculation trigger signals CR and CW, respectively.

According to the present invention, measured values representing the positions of the mask stage and the substrate stage are read or sampled in synchronism with the timing signals produced from a first and second displacement detection means, respectively, and the difference between the read or sampled measured values is divided by the interval of the signals obtained based on the timing signals so as to derive the calculated values representing the velocities of the mask stage and the substrate stage in the scanning direction with great accuracy. Therefore, the velocities of the mask stage and the substrate stage in their movements for scanning can be controlled with precision, so that an image of the pattern can be transferred from the mask onto the photosensitive substrate with a desired magnification ratio in the scanning direction and without any distortion in the transferred image in the scanning direction.

Although one particular embodiment of the present invention has been shown and described in detail, it should be understood that various changes, alterations and modifications may be made thereto, and the present invention is not limited to the described embodiment but may be embodied in various other forms without departing from the spirit and the scope of the present invention.

What is claimed is:

1. A scanning projection exposure apparatus comprising:
   a mask stage for carrying a mask having a pattern;
   a substrate stage for carrying a photosensitive substrate to which an image of said pattern is transferred;
   a mechanism for moving said mask stage in a predetermined scanning direction and moving said substrate stage in a predetermined scanning direction which is an opposite direction with respect to a predetermined scanning direction of said mask stage;
   a first displacement detection device for measuring the position of said mask stage and outputting position information of said mask stage with a predetermined first timing;
   a second displacement detection device for measuring the position of said substrate stage and outputting position information of said substrate stage with a predetermined second timing;
   a first velocity calculation unit for calculating velocity of said mask stage based on said first timing of said first displacement detection device;
   a second velocity calculation unit for calculating velocity of said substrate stage based on said second timing of said second displacement detection device; and
   a stage control unit for controlling the velocities of said mask stage and said substrate stage based on the calculated velocities derived by said first and second velocity units.

2. A scanning projection exposure apparatus according to claim 1, wherein said first velocity calculation unit is connected with said first displacement detection device and has a first frequency divider which effects frequency-division operations to said first timing.

3. A scanning projection exposure apparatus according to claim 2, wherein said first velocity calculation unit carries out said calculation in synchronism with output from said first frequency divider.

4. A scanning projection exposure apparatus according to claim 2, wherein a period of said first timing is substantially 100 μsec and the frequency-division ratio of said first frequency divider is ¹/₁₀.

5. A scanning projection exposure apparatus according to claim 1, wherein said second velocity calculation unit is connected with said second detection device and has a second frequency divider which effects frequency-division operations to said second timing.

6. A scanning projection exposure apparatus according to claim 5, wherein said second velocity calculation unit carries out said calculation in synchronism with output from said second frequency divider.

7. A scanning projection exposure apparatus according to claim 1, wherein said first velocity calculation unit carries out said calculation in synchronism with said first timing.

8. A scanning projection exposure apparatus according to claim 1, wherein said second velocity calculation unit carries out said calculation in synchronism with said second timing.

9. A scanning projection exposure apparatus according to claim 1, wherein said velocity calculation unit carries out said calculation with a period of substantially 1 msec.

10. A scanning projection exposure apparatus according to claim 1 further comprising:

a projection optical system by which an image of said pattern is reduced on said photosensitive substrate and projected onto said photosensitive substrate, said stage control unit controls said substrate stage so as to be moved at the velocity which is given as the product of a velocity calculated by said second velocity calculation unit and said predetermined reduction ratio.

11. A scanning projection exposure method wherein a mask stage is moved in a first predetermined scanning direction which is an opposite direction with respect to a second predetermined scanning direction of said substrate stage, said mask stage carrying a mask having a pattern and said substrate stage carrying a photosensitive substrate to which an image of said pattern is transferred by exposure, said scanning projection exposure method comprising the steps of:

measuring the position of said mask stage with predetermined sampling time intervals;

calculating velocity of said mask stage in synchronism with said sampling time intervals; and controlling the velocities of said mask stage based on the calculated velocities of said mask stage.

12. A scanning projection exposure method according to claim 11 further comprising the steps of:

measuring the position of said photosensitive substrate with predetermined sampling time intervals;

calculating velocity of said substrate stage in synchronism with said sampling time intervals; and controlling the velocities of said substrate stage based on the calculated velocities of said substrate stage.

13. A scanning projection exposure method according to claim 11 further comprising the step effecting frequency-division operations to said sampling time intervals, said calculation of velocity of said mask stage being carried out in synchronism with time intervals of said frequency-division operations.

14. A scanning projection exposure method wherein a mask is moved in a first predetermined scanning direction which is an opposite direction with respect to a second predetermined scanning direction of a photosensitive substrate, said mask having a pattern, and an image of said pattern of mask being transferred to said photosensitive substrate by exposure, said scanning projection exposure method comprising the steps of:

measuring the position of said photosensitive substrate with predetermined sampling time intervals;

calculating velocity of said photosensitive substrate in synchronism with said sampling time intervals; and controlling the velocities of said photosensitive substrate based on the calculated velocities of said photosensitive substrate.

15. A scanning projection exposure method according to claim 14 further comprising the steps of:

measuring the position of said mask with predetermined sampling time intervals;

calculating velocities of said mask in synchronism with said sampling time intervals; and controlling the velocities of said mask based on the calculated velocities of said mask.

16. A scanning projection exposure method according to claim 14 further comprising the step of effecting frequency-division operations to said sampling time intervals, said calculation of velocity of said mask stage being carried out in synchronism with time intervals of said frequency-division operations.

17. A scanning projection exposure method according to claim 14, wherein said sampling time interval is substantially 100 μsec.

* * * * *

UNITED STATES PATENT AND TRADEMARK OFFICE
CERTIFICATE OF CORRECTION

PATENT NO.:  5,699,146
DATED     :  December 16, 1997
INVENTOR(S): Takeshi KAMINAGA It is certified that the error appears in the above-identified patent and that said Letters Patent is hereby corrected as shown below:

On the Title page, item [54], and col. 1,
The Title should read:

SCANNING PROJECTION EXPOSURE APPARATUS AND METHOD OF PERFORMING A SCANNING PROJECTION EXPOSURE.

Signed and Sealed this

Second Day of June, 1998

Attest:

BRUCE LEHMAN

*Attesting Officer*    Commissioner of Patents and Trademarks